(12) United States Patent
Yamaura

(10) Patent No.: US 8,637,952 B2
(45) Date of Patent: Jan. 28, 2014

(54) SEMICONDUCTOR DEVICE WITH ZENER DIODE AND METHOD FOR MANUFACTURING SAME

(75) Inventor: Kazuaki Yamaura, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 202 days.

(21) Appl. No.: 13/045,504

(22) Filed: Mar. 10, 2011

(65) Prior Publication Data

US 2011/0266650 A1 Nov. 3, 2011

(30) Foreign Application Priority Data

Apr. 28, 2010 (JP) ................................ 2010-103916

(51) Int. Cl.
*H01L 29/66* (2006.01)
(52) U.S. Cl.
USPC .................... 257/484; 257/544; 257/E29.019
(58) Field of Classification Search
USPC .................................... 257/484, 544, E29.019
See application file for complete search history.

(56) References Cited

U.S. PATENT DOCUMENTS

| | | | | |
|---|---|---|---|---|
| 4,035,907 | A * | 7/1977 | Allen et al. ................... | 438/534 |
| 4,089,020 | A * | 5/1978 | Ikeda et al. ................... | 257/475 |
| 6,426,541 | B2 * | 7/2002 | Chang et al. .................. | 257/472 |
| 7,893,467 | B2 * | 2/2011 | Yamamoto et al. ........... | 257/280 |
| 2002/0140054 | A1 | 10/2002 | Matsushita | |
| 2002/0158246 | A1* | 10/2002 | Kitamura et al. ............... | 257/46 |
| 2010/0244194 | A1* | 9/2010 | Masada et al. ................. | 257/605 |

FOREIGN PATENT DOCUMENTS

| | | |
|---|---|---|
| JP | 02-296374 A | 12/1990 |
| JP | 04-127576 | 4/1992 |
| JP | 04-259260 A | 9/1992 |
| JP | 06-045597 A | 2/1994 |
| JP | 09-064379 A | 3/1997 |
| JP | 2004-214575 | 7/2004 |
| JP | 2006-165370 | 6/2006 |

OTHER PUBLICATIONS

Japanese Office Action dated Oct. 9, 2013, filed in Japanese counterpart Application No. 2010-103916, 6 pages (with translation).

* cited by examiner

*Primary Examiner* — Phat X Cao
(74) *Attorney, Agent, or Firm* — Patterson & Sheridan, LLP

(57) ABSTRACT

According to one embodiment, a semiconductor device includes a semiconductor substrate, a first conductivity type region, a device isolation insulating film, a second conductivity type region, and a low concentration region. The first conductivity type region is formed in part of the semiconductor substrate. The device isolation insulating film is formed in an upper surface of the semiconductor substrate and includes an opening formed in part of an immediately overlying region of the first conductivity type region. The second conductivity type region is formed in the opening and is in contact with the first conductivity type region. The low concentration region is formed along a side surface of the opening, has second conductivity type, has an effective impurity concentration lower than an effective impurity concentration of the second conductivity type region, and separates an interface of the first conductivity type region and the second conductivity type region from the device isolation insulating film.

20 Claims, 7 Drawing Sheets

US 8,637,952 B2

SEMICONDUCTOR DEVICE WITH ZENER DIODE AND METHOD FOR MANUFACTURING SAME

CROSS-REFERENCE TO RELATED APPLICATIONS

This application is based upon and claims the benefit of priority from the prior Japanese Patent Application No. 2010-103916, filed on Apr. 28, 2010; the entire contents of which are incorporated herein by reference.

FIELD

Embodiments described herein relate generally to a semiconductor device and a method for manufacturing the same.

BACKGROUND

Conventionally, a technique is disclosed for incorporating a Zener diode in a semiconductor device by forming a p-type region and an n-type region in contact with each other in a semiconductor substrate. Recently, with the increase in the packing density of semiconductor devices, the Zener diode is also required to be downsized while maintaining the stability of characteristics.

BRIEF DESCRIPTION OF THE DRAWINGS

FIG. 8A shows the comparative example and FIG. 8B shows the first embodiment.

DETAILED DESCRIPTION

Figure 1:
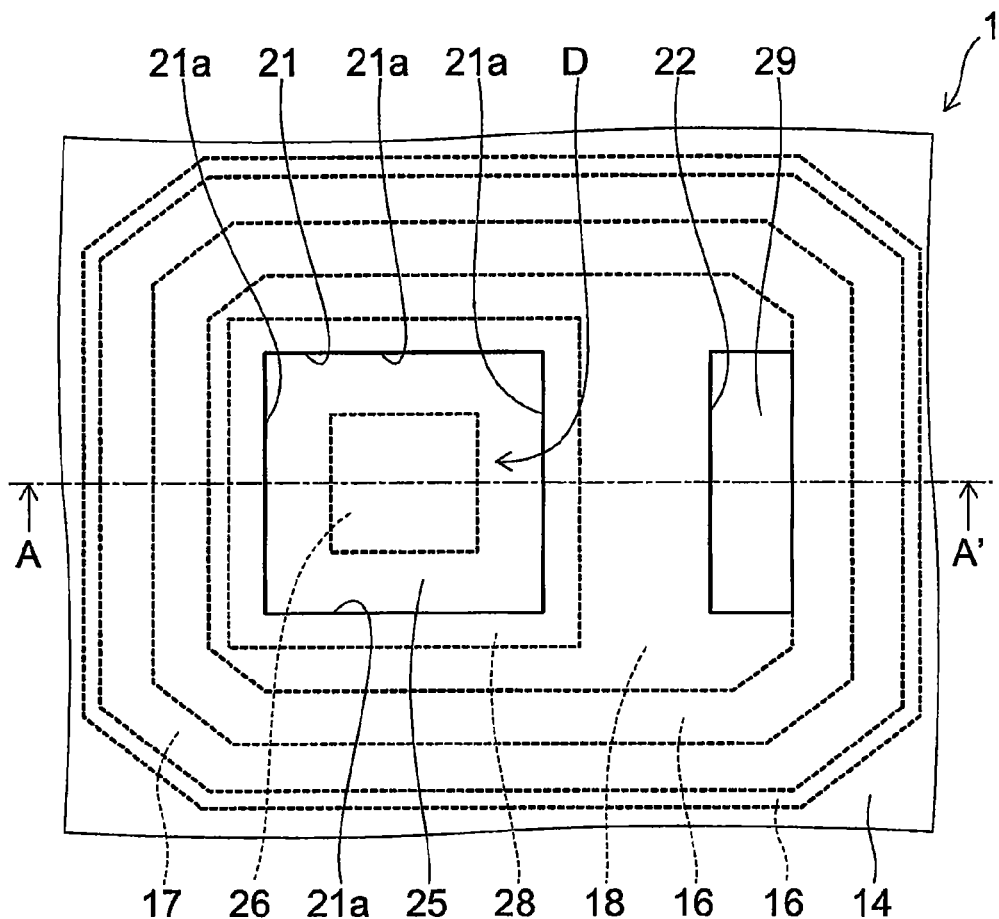
FIG. 1 is a plan view illustrating a semiconductor device according to a first embodiment.

In general, according to one embodiment, a semiconductor device includes a semiconductor substrate, a first conductivity type region, a device isolation insulating film, a second conductivity type region, and a low concentration region. The first conductivity type region is formed in part of the semiconductor substrate. The device isolation insulating film is formed in an upper surface of the semiconductor substrate and includes an opening formed in part of an immediately overlying region of the first conductivity type region. The second conductivity type region is formed in the opening and is in contact with the first conductivity type region. The low concentration region is formed along a side surface of the opening, has second conductivity type, has an effective impurity concentration lower than an effective impurity concentration of the second conductivity type region, and separates an interface of the first conductivity type region and the second conductivity type region from the device isolation insulating film.

According to another embodiment, a semiconductor device includes a semiconductor substrate, a first conductivity type region, a device isolation insulating film, a second conductivity type region, and a low concentration region. The first conductivity type region is formed in part of the semiconductor substrate. The device isolation insulating film is formed in an upper surface of the semiconductor substrate and includes an opening formed in part of an immediately overlying region of the first conductivity type region. The second conductivity type region is formed in the opening and is in contact with the first conductivity type region. The low concentration region is formed along a side surface of the opening by impurity implantation, has an effective impurity concentration lower than an effective impurity concentration of the first conductivity type region and the second conductivity type region, and separates an interface of the first conductivity type region and the second conductivity type region from the device isolation insulating film.

According to yet another embodiment, a method is disclosed for manufacturing a semiconductor device. The method can include forming a first conductivity type region in part of a semiconductor substrate. The method can include forming a device isolation insulating film in an upper surface of the semiconductor substrate. The device isolation insulating film includes an opening formed in part of an immediately overlying region of the first conductivity type region. The method can include implanting second conductivity type impurity into a region including a side surface of the opening as viewed from above to form a low concentration region along the side surface. The low concentration region has an effective impurity concentration lower than an effective impurity concentration of the first conductivity type region. In addition, the method can include forming a second conductivity type region in the opening so as to be in contact with the first conductivity type region. The second conductivity type region has an effective impurity concentration higher than an effective impurity concentration of the low concentration region. An interface of the first conductivity type region and the second conductivity type region is separated from the device isolation insulating film by the low concentration region.

Embodiments of the invention will now be described with reference to the drawings.

First, a first embodiment is described.

FIG. 1 is a plan view illustrating a semiconductor device according to this embodiment.

Figure 2:
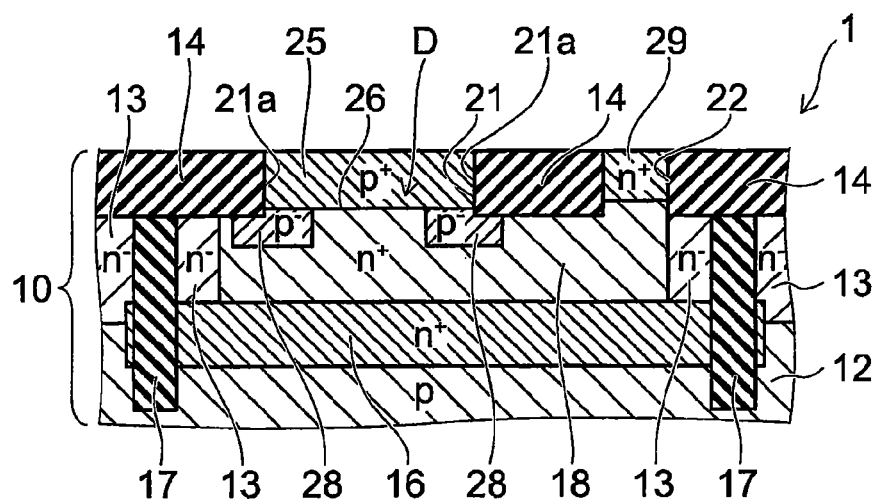
FIG. 2 is a cross-sectional view taken along line A-A' shown in FIG. 1.

FIG. 2 is a cross-sectional view taken along line A-A' shown in FIG. 1.

As shown in FIGS. 1 and 2, the semiconductor device 1 according to this embodiment includes a silicon substrate 10. The silicon substrate 10 includes a p-type matrix 12 made of single crystal silicon having p-type conductivity, and an epitaxial layer 13 formed on the p-type matrix 12. The epitaxial layer 13 is a silicon layer epitaxially grown from the upper surface of the p-type matrix 12, and has n-type conductivity. A device isolation insulating film 14 made of e.g. silicon oxide is provided on the epitaxial layer 13. That is, the device isolation insulating film 14 is formed on the upper surface of the silicon substrate 10.

In part of the upper portion of the p-type matrix 12, a high concentration region 16 having n-type conductivity is layered. As viewed from above, the high concentration region 16 is shaped like a rectangle with truncated corners. The effective impurity concentration of the high concentration region 16 is higher than the effective impurity concentration of the epitaxial layer 13. Here, the "effective impurity concentration" refers to the concentration of impurities contributing to the electrical conduction of the base semiconductor material. In the case where a semiconductor material contains both donor impurity (hereinafter also referred to as "n-type impurity") and acceptor impurity (hereinafter also referred to as "p-type impurity"), the "effective impurity concentration" refers to the value of the concentration excluding the amount of cancellation.

Furthermore, a frame member 17 made of an insulating material such as silicon oxide is provided in the silicon substrate 10. As viewed from above, the frame member 17 is located inside the outer edge of the high concentration region 16. The frame member 17 has a shape extending along the outer edge of the high concentration region 16. That is, the frame member 17 is shaped like a rectangle with truncated corners. The upper end of the frame member 17 is in contact with the lower surface of the device isolation insulating film 14. The central portion of the frame member 17 penetrates through the epitaxial layer 13 and the high concentration region 16. The lower end of the frame member 17 reaches into the p-type matrix 12.

An n-type region 18 having n-type conductivity is formed in the portion of the epitaxial layer 13 surrounded by the frame member 17. The effective impurity concentration of the n-type region 18 is higher than the effective impurity concentration of the epitaxial layer 13 and lower than the impurity concentration of the high concentration region 16. As viewed from above, the n-type region 18 is not in contact with the frame member 17, but located generally throughout the region surrounded by the frame member 17. The outer edge of the n-type region 18 has a shape extending along the frame member 17 and is shaped like a rectangle with truncated corners. The n-type region 18 is formed throughout the thickness of the epitaxial layer 13. The lower surface of the n-type region 18 is in contact with the upper surface of the high concentration region 16. The upper surface of the n-type region 18 is in contact with the lower surface of the device isolation insulating film 14.

The device isolation insulating film 14 includes two openings 21 and 22 spaced from each other. The opening 21 is formed immediately above the vicinity of the center of the n-type region 18. As viewed from above, the opening 21 is shaped like e.g. a square. The opening 22 is formed immediately above the end portion of the n-type region 18. The opening 22 is shaped like e.g. a rectangle. The longitudinal direction of the opening 22 coincides with the widthwise direction of the n-type region 18.

A p-type region 25 having p-type conductivity is formed inside the opening 21. The p-type region 25 is formed throughout the region in the opening 21. Hence, the p-type region 25 is in contact with the side surface 21a of the opening 21. The lower surface of the p-type region 25 is in contact with the upper surface of the n-type region 18 and constitutes a pn interface 26. The pn interface 26 is located above the lower surface of the device isolation insulating film 14.

A low concentration region 28 is formed along the side surface 21a of the opening 21 below the device isolation insulating film 14 and the p-type region 25. Hence, as viewed from above, the low concentration region 28 is shaped like a frame including the side surface 21a. The low concentration region 28 has p-type conductivity. The effective impurity concentration thereof is lower than the effective impurity concentration of the p-type region 25 and the n-type region 18. The low concentration region 28 is in contact with the peripheral portion of the lower surface of the p-type region 25, the lower portion of the side surface 21a of the opening 21 of the device Isolation insulating film 14, and the portion near the opening 21 of the lower surface of the device isolation insulating film 14. And the low concentration region 28 covers continuously the peripheral portion of the lower surface of the p-type region 25, the lower portion of the side surface 21a of the opening 21 of the device isolation insulating film 14, and the portion being in contact with the side surface 21a of the lower surface of the device isolation insulating film 14. Thus, the low concentration region 28 separates the pn interface 26 from the device isolation insulating film 14. In other words, because of the presence of the low concentration region 28, there is no triple point at which the device isolation insulating film 14, the n-type region 18, and the p-type region 25 are in contact with one another.

A contact region 29 is formed in the opening 22 of the device isolation insulating film 14. The contact region 29 has n-type conductivity. The effective impurity concentration thereof. Is higher than the effective impurity concentration of the n-type region 18. The lower surface of the contact region 29 is in contact with the upper surface of the n-type region 18. Thus, the contact region 29 is connected to the n-type region 18.

Next, a method for manufacturing a semiconductor device according to this embodiment configured as described above is described.

FIGS. 3A to 3D and FIGS. 4A to 4D are process cross-sectional views illustrating the method for manufacturing a semiconductor device according to this embodiment.

Figure 3A:
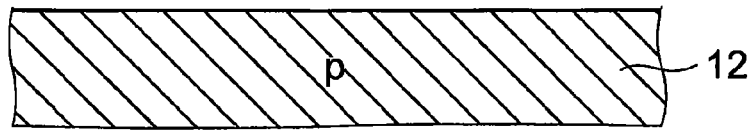
FIGS. 3A to 3D are process cross-sectional views illustrating a method for manufacturing a semiconductor device according to the first embodiment.

First, as shown in FIG. 3A, a p-type matrix 12 having p-type conductivity is prepared. The p-type matrix 12 is a silicon wafer doped with p-type impurity such as boron.

Figure 3B:
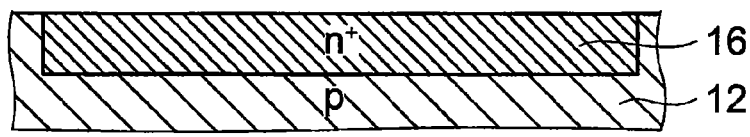

Next, as shown in FIG. 3B, n-type impurity such as phosphorus is ion-implanted into part of the upper portion of the p-type matrix 12 to form a high concentration region 16 having n-type conductivity.

Figure 3C:
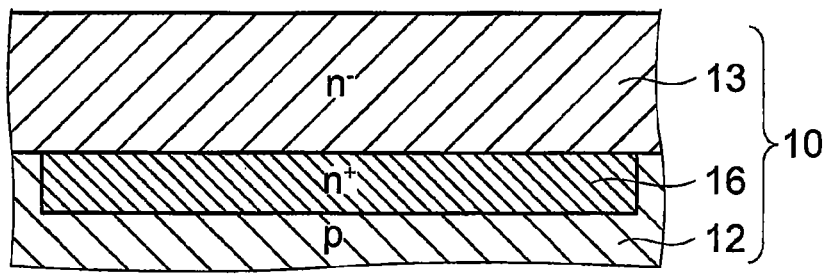

Next, as shown in FIG. 3C, n-type silicon is epitaxially grown on the p-type matrix 12 to form an epitaxial layer 13. The thickness of the epitaxial layer 13 is set to e.g. 5 μm. The p-type matrix 12 and the epitaxial layer 13 constitute a silicon substrate 10.

Figure 3D:
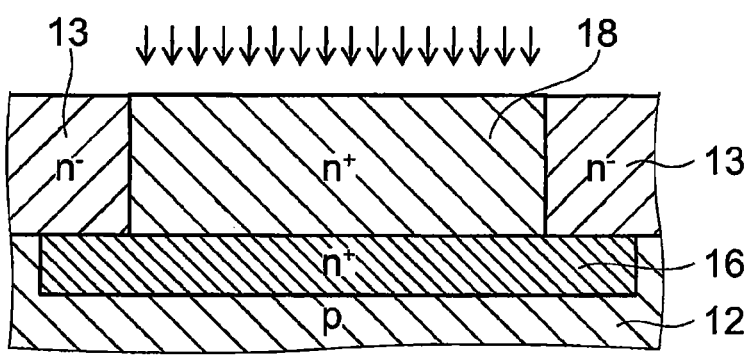

Next, as shown in FIG. 3D, n-type impurity is ion-implanted into part of the epitaxial layer 13. The acceleration voltage in this ion implantation is set to e.g. 80 keV. The dose amount is set so that the effective impurity concentration of the n-type region 18 to be formed is made lower than the effective impurity concentration of the high concentration region 16. For instance, the dose amount is set to the order of $1 \times 10^{15}$ cm$^{-2}$. Next, heat treatment is performed at a temperature of e.g. 1100° C. for a duration of e.g. 50 minutes to thermally diffuse the introduced n-type impurity. Thus, by ion implantation and thermal diffusion, an n-type region 18 having n-type conductivity is formed. The n-type region 18 is formed throughout the thickness of the epitaxial layer 13 and in contact with the high concentration region 16. Furthermore, as shown in FIG. 1, as viewed from above, the n-type region 18 is shaped like a rectangle with truncated corners.

Figure 4A:
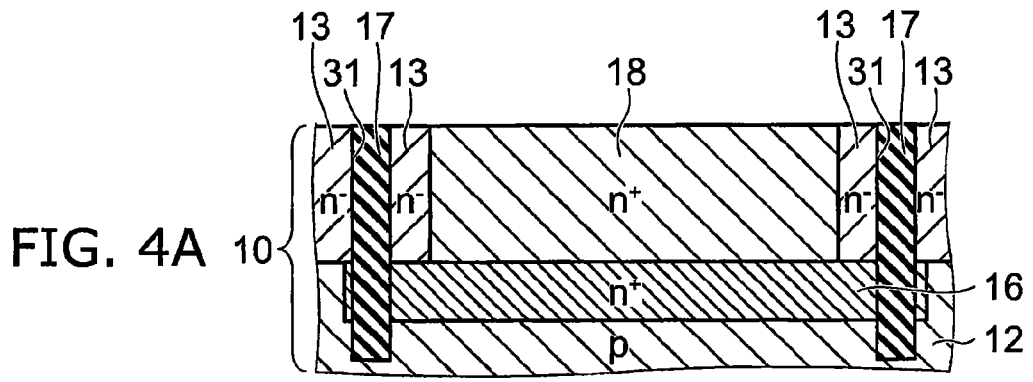
FIGS. 4A to 4D are process cross-sectional views illustrating the method for manufacturing a semiconductor device according to the first embodiment.

Next, as shown in FIG. 4A, a deep trench 31 is formed in the silicon substrate 10 from the upper surface side. As viewed from above, the deep trench 31 is formed like a frame surrounding the n-type region 18. The depth of the deep trench 31 is set so that the deep trench 31 penetrates through the epitaxial layer 13 and the high concentration region 16 to the portion of the p-type matrix 12 located immediately below the high concentration region 16. Next, a frame member 17 is formed by burying an Insulating material such as silicon oxide into the deep trench 31.

Figure 4B:
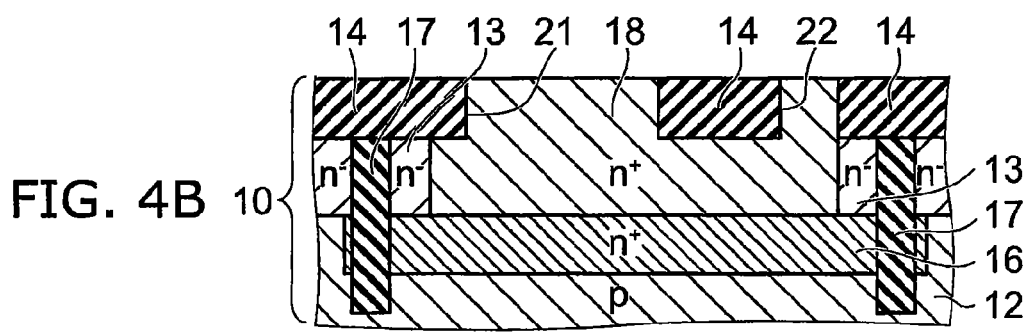

Next, as shown in FIG. 4B, a device isolation insulating film 14 made of an insulating material such as silicon oxide is selectively formed in the upper surface of the silicon substrate 10. The thickness of the device isolation insulating film 14 is set to e.g. 0.275 μm. At this time, openings 21 and 22 are formed in the device isolation insulating film 14. As viewed from above, the opening 21 is formed near the center of the n-type region 18, and the opening 22 is formed in the end portion of the n-type region 18. The epitaxial layer 13 is left inside the openings 21 and 22.

Figure 4C:
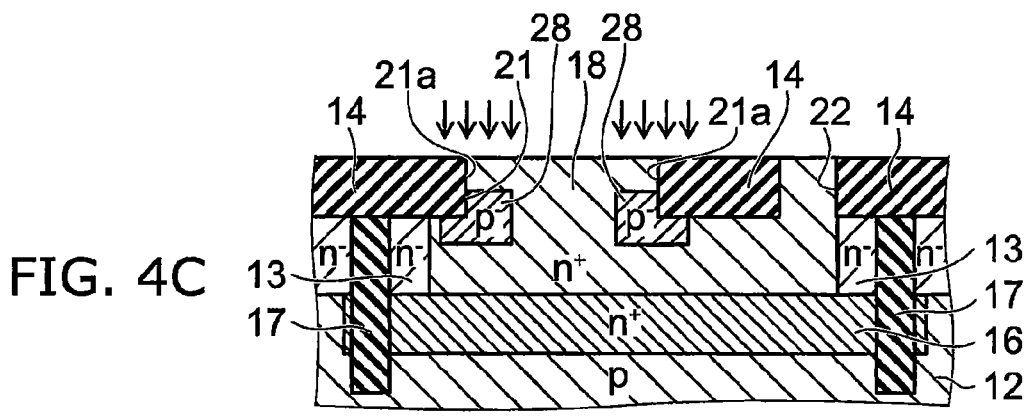

Next, as shown in FIG. 4C, p-type impurity is ion-implanted into a region including the side surface 21a of the opening 21 as viewed from above. In this ion implantation, the acceleration voltage is made relatively high, such as 260 keV, so that the p-type impurity reaches a depth comparable to the lower surface of the device isolation insulating film 14, e.g., a depth of approximately 0.2 μm from the upper surface of the silicon substrate 10. The dose amount is set so that the conductivity type of the portion of the epitaxial layer 13 doped with the p-type impurity is inverted to p-type and that the effective impurity concentration is made lower than the effective impurity concentration of the p-type region 25 to be formed subsequently. For instance, the dose amount is set to the order of $1\times10^{13}$ cm$^{-2}$. Thus, a low concentration region 28 having p-type conductivity whose effective impurity concentration is lower than the effective impurity concentration of the n-type region 18 and the p-type region 25 is formed along the side surface 21a of the opening 21.

Figure 4D:
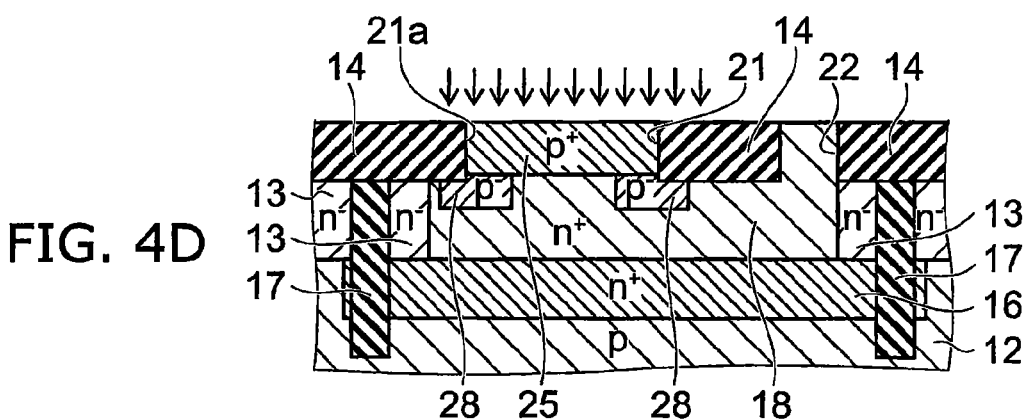

Next, as shown in FIG. 4D, from above the silicon substrate 10, p-type impurity is ion-implanted into the region including the entire opening 21 of the device isolation insulating film 14. In this ion implantation, the acceleration voltage is made lower and the dose amount is made higher than in the ion implantation for forming the low concentration region 28 shown in FIG. 4C. For instance, the acceleration voltage is set to 5 keV, and the dose amount is set to the order of $1\times10^{15}$ cm$^{-2}$. Hence, with the device isolation insulating film 14 used as a mask, p-type impurity is introduced into a region shallower than the low concentration region 28 with a higher concentration than the low concentration region 28. Thus, a p-type region 25 is formed in the opening 21 in a self-aligned manner.

The effective impurity concentration of the p-type region 25 is made higher than the effective impurity concentration of the low concentration region 28. The central portion of the lower surface of the p-type region 25 is in contact with the upper surface of the n-type region 18. The peripheral portion of the lower surface of the p-type region 25 is in contact with the upper surface of the low concentration region 28. The side surface of the p-type region 25 is in contact with the side surface 21a of the opening 21. Here, the low concentration region 28 is interposed between the device isolation insulating film 14 and the pn interface 26 of the p-type region 25 and the n-type region 18. That is, the interface 26 is separated from the device isolation insulating film 14 by the low concentration region 28.

Next, as shown in FIG. 1 and FIG. 2, n-type impurity is ion-implanted into the entire opening 22 of the device isolation insulating film 14. Thus, a contact region 29 is formed inside the opening 22. Subsequently, the silicon wafer is diced. Thus, a semiconductor device 1 is manufactured.

Next, operation effects of this embodiment are described.

In the semiconductor device 1, the p-type region 25 and the n-type region 18 are in contact with each other to form a diode D with the p-type region 25 serving as an anode and the n-type region 18 serving as a cathode. The p-type region 25 is applied with a relatively negative potential, and the contact region 29 is applied with a relatively positive potential. Hence, the pn interface 26 of the p-type region 25 and the n-type region 18 is applied with a reverse bias voltage. Thus, the diode D functions as a Zener diode. As viewed from above, the frame member 17 and the region surrounded by the frame member 17 constitute a Zener diode region.

Here, the effective impurity concentration of the low concentration region 28 is lower than the effective impurity concentration of the p-type region 25. Hence, little current flows through the interface of the low concentration region 28 and the n-type region 18. The pn interface 26 is the only Zener junction in the diode D through which the current substantially flows. In the semiconductor device 1, the pn interface 26 is separated from the device isolation insulating film 14 by the low concentration region 28. Hence, there is no charge-up of the device isolation insulating film 14 resulting from accumulation of charge in the device isolation insulating film 14 associated with the operation of the diode D. Thus, there is no variation in the Zener voltage (Vz) of the diode D due to such charge-up. This can stabilize the operation of the diode D. In contrast, if the Zener junction is in contact with the device isolation insulating film 14, charge is accumulated in the device isolation insulating film 14 and varies the Zener voltage.

Furthermore, in this embodiment, the low concentration region 28 is formed by the ion implantation method. Hence, the low concentration region 28 can be formed in a narrow region. This can reduce the Zener diode region, and downsize the semiconductor device 1.

Furthermore, in this embodiment, the n-type region 18 is formed generally throughout the Zener diode region, i.e., in a wide region including the immediately underlying region of the opening 21. Thus, the region of the lower surface of the p-type region 25 not covered with the low concentration region 28 is reliably brought into contact with the n-type region 18 to form a pn interface 26. This can reduce the dependence of the Zener voltage on the Zener area, i.e., on the area of the pn interface 26, and downsize the semiconductor device 1.

Moreover, in the semiconductor device 1, as viewed from above, the pn interface 26 and the contact region 29 are located inside the n-type region 18 having a generally rectangular shape. Thus, the n-type region 18 is located also on and around the shortest path between the portion of the n-type region 18 immediately below the pn interface 26 and the portion immediately below the contact region 29. Hence, the Zener current can flow on this shortest path by conducting in the n-type region 18. This can reduce the parasitic resistance of the diode D.

Moreover, in the semiconductor device 1, the high concentration region 16 is provided immediately below the n-type region 18. The high concentration region 16 has the same conductivity type as the n-type region 18, but has a higher effective impurity concentration than the n-type region 18. Hence, the resistivity of the high concentration region 16 is lower than the resistivity of the n-type region 18. Thus, part of the Zener current can flow in the high concentration region 16. This can further reduce the parasitic resistance of the diode D.

Moreover, in the semiconductor device 1, the insulative frame member 17 is provided around the n-type region 18. Hence, the inside of the frame member 17 can be effectively electrically isolated from the outside of the frame member 17. This can shorten the distance between the diode D and the adjacent device element, and downsize the semiconductor device 1.

Next, a second embodiment is described.

Figure 5:
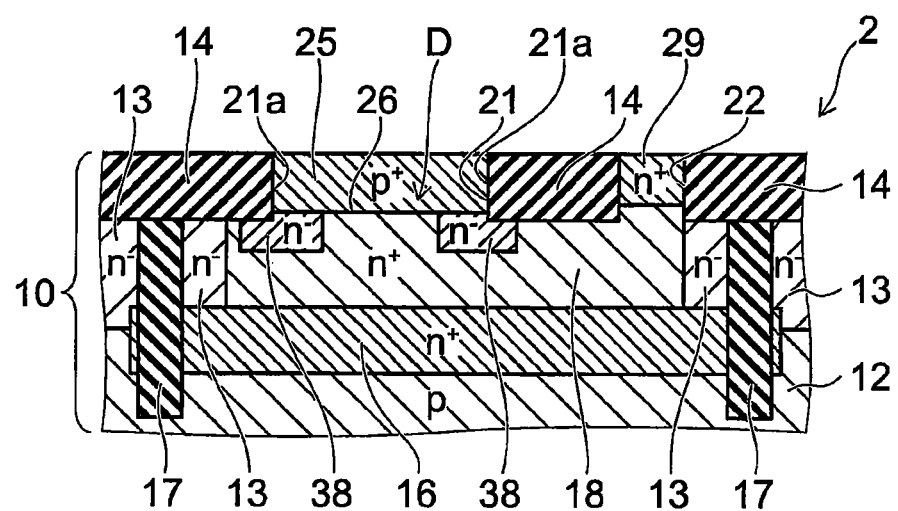
FIG. 5 is a cross-sectional view illustrating a semiconductor device according to a second embodiment.

FIG. 5 is a cross-sectional view illustrating a semiconductor device according to this embodiment.

As shown in FIG. 5, the semiconductor device 2 according to this embodiment is different from the semiconductor device 1 (see FIG. 1 and FIG. 2) according to the above first embodiment in that the low concentration region 28 (see FIG. 2) having p-type conductivity is replaced by a low concentration region 38 having n-type conductivity. The effective impurity concentration of the low concentration region 38 is lower than the effective impurity concentration of the n-type region 18. This semiconductor device 2 can be manufactured by decreasing the amount of p-type impurity implanted in the process shown in FIG. 4C to such an amount that the conductivity type of the low concentration region 38 formed in the n-type region 18 is not inverted to p-type.

In the semiconductor device 2, a pn junction interface is formed between the p-type region 25 and the low concentration region 38. However, the effective impurity concentration of the low concentration region 38 is lower than the effective impurity concentration of the n-type region 18. Hence, little current flows through the interface of the p-type region 25 and the low concentration region 38. Thus, also in the semiconductor device 2 according to this embodiment, as in the semiconductor device 1 (see FIG. 2) according to the above first embodiment, the pn interface 26 between the p-type region 25 and the n-type region 18 is the only Zener junction through which the current substantially flows. Hence, the Zener junction is separated from the device isolation insulating film 14 by the low concentration region 38. As in the above first embodiment, this can prevent charge-up of the device isolation insulating film 14 and prevent variation of the Zener voltage. The configuration, manufacturing method, and the operational effects of this embodiment other than the foregoing are similar to those of the above first embodiment.

Next, a comparative example of the first embodiment is described.

Figure 6:
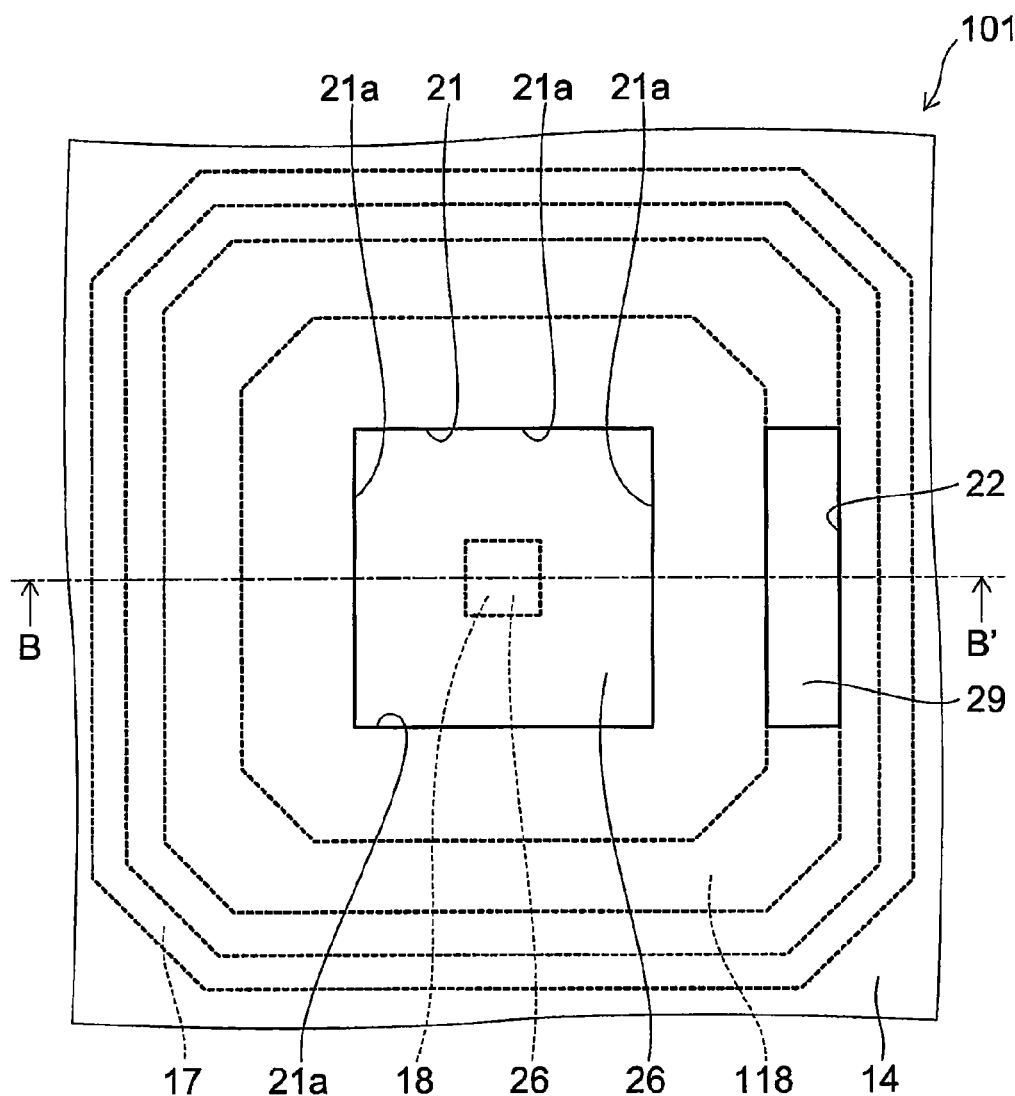
FIG. 6 is a plan view illustrating a semiconductor device according to a comparative example.

FIG. 6 is a plan view illustrating a semiconductor device according to this comparative example.

Figure 7:
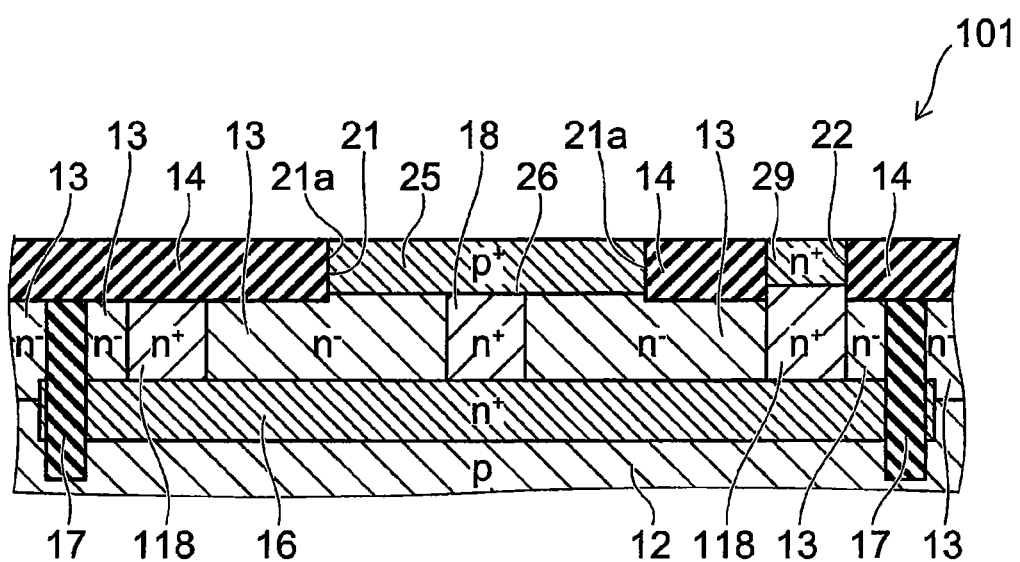
FIG. 7 is a cross-sectional view taken along line B-B' shown in FIG. 6.

FIG. 7 is a cross-sectional view taken along line B-B' shown in FIG. 6.

As shown in FIGS. 6 and 7, the semiconductor device 101 according to this comparative example includes no low concentration region 28 (see FIG. 2). Hence, to separate the pn interface 26 of the p-type region 25 and the n-type region 18 from the device isolation insulating film 14, the n-type region 18 is formed only in the central portion in the opening 21 as viewed from above. Furthermore, to ensure electrical continuity between the n-type region 18 and the contact region 29, the n-type region 18 reaches the high concentration region 16, and an n-type region 118 is formed between the contact region 29 and the high concentration region 16. Thus, the n-type region 18 is connected to the contact region 29 through the high concentration region 16 and the n-type region 118. To reduce the resistance between the n-type region 18 and the contact region 29, the n-type region 118 is formed like a frame surrounding the opening 21. The frame member 17 is located further outside the n-type region 118.

Also in the semiconductor device 101, the p-type region 25 and the n-type region 18 constitute a diode, which can be used as a Zener diode. In this case, the pn interface 26 serves as a Zener junction. However, in the semiconductor device 101, to separate the pn interface 26 from the device isolation insulating film 14, the n-type region 18 needs to be formed only in the region immediately below the central portion of the opening 21, and the n-type region 18 is connected to the n-type region 118 through the high concentration region 16. Hence, the n-type region 18 needs to be formed thickly so as to be in contact with both the p-type region 25 and the high concentration region 16. Thus, the n-type region 18 needs to be formed by ion implantation and thermal diffusion. However, in this case, n-type impurity contained in the n-type region 18 diffuses also laterally by thermal diffusion, and the n-type region 18 expands laterally. Hence, the region to be doped with n-type impurity needs to be sufficiently spaced from the side surface 21a of the opening 21. However, this increases the area of the Zener diode region. This also holds for the n-type region 118.

Furthermore, the n-type region 18 is connected to the n-type region 118 through the high concentration region 16. Hence, most of the current flowing between the n-type region 18 and the n-type region 118 cannot flow on the shortest path. Thus, the resistance between the n-type region 18 and the contact region 29 is made higher than in the case where the n-type region 18 is formed generally throughout the Zener diode region as in the above first embodiment. To compensate for this, the n-type region 18 needs to be formed like a frame surrounding the opening 21. However, this increases the area of the Zener diode region.

In contrast, in the above first embodiment, the low concentration region 28 is formed to separate the pn interface 26 from the device isolation insulating film 14. The low concentration region 28 can be formed thinly because it only needs to be in contact with the p-type region 25, the n-type region 18, and the device isolation insulating film 14. Thus, the low concentration region 28 can be formed only by ion implantation without using thermal diffusion. Because thermal diffusion is not performed, the low concentration region 28 is not laterally diffused by thermal diffusion, but can be formed in a narrow region as viewed from above. This can shorten the distance between the pn interface and the device isolation insulating film 14, and reduce the area of the Zener diode region.

Furthermore, in the above first embodiment, the n-type region 18 does not need to be formed so as to avoid the immediately underlying region of the side surface 21a of the opening 21, but can be formed throughout the Zener diode region. Hence, the n-type region 18 can be directly connected to the contact region 29. Thus, the parasitic resistance of the diode is reduced, and the need of the n-type region 118 (see FIG. 6) like a frame surrounding the opening 21 is eliminated. This can also reduce the area of the Zener diode region.

In the following, this effect is described with reference to specific numerical examples.

Figure 8A:
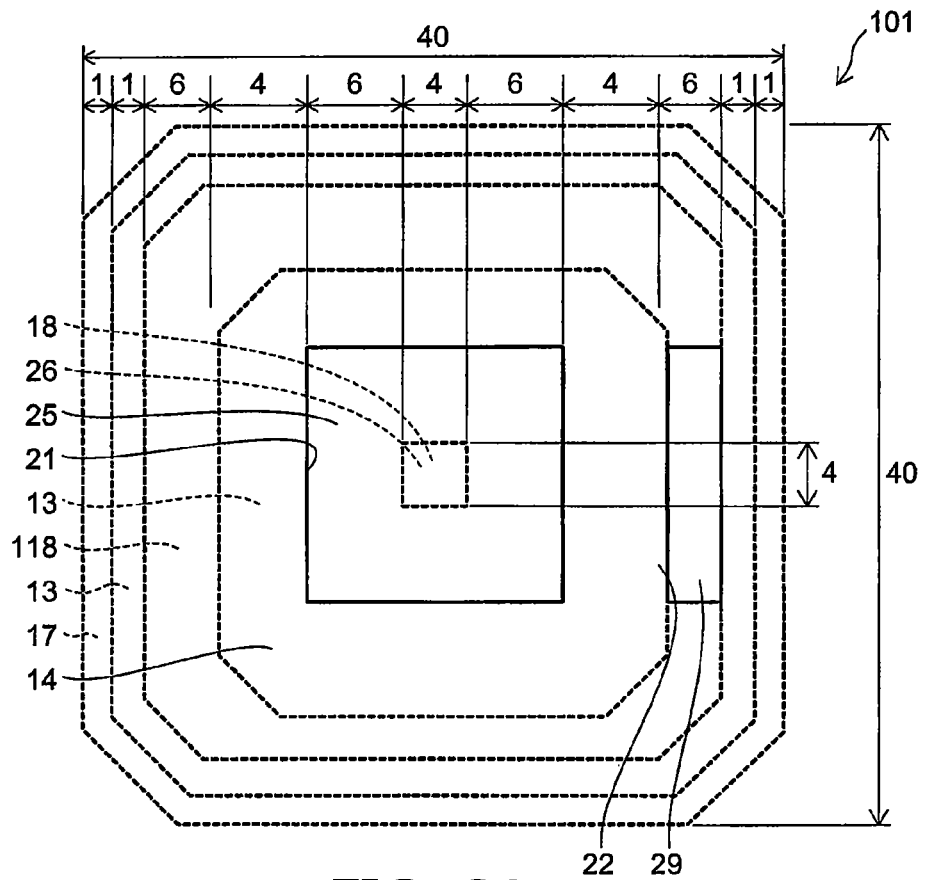
FIGS. 8A and 8B are plan views illustrating a Zener diode region of the semiconductor devices, where
Figure 8B:
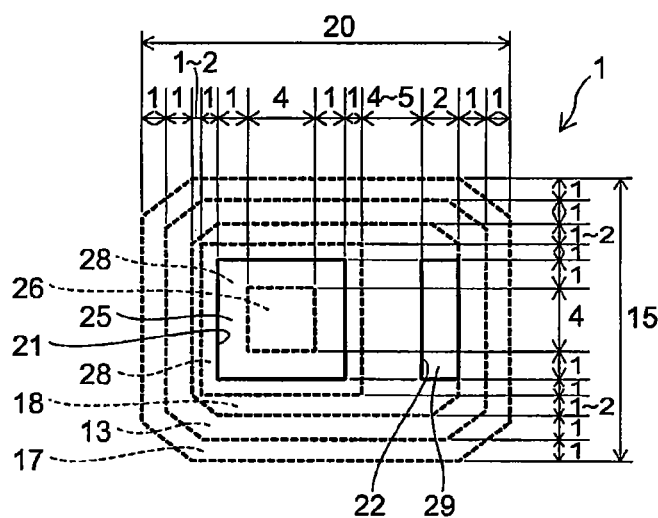

FIGS. 8A and 8B are plan views illustrating the Zener diode region of the semiconductor devices. FIG. 8A shows this comparative example, and FIG. 8B shows the above first embodiment.

The unit of dimensions indicated in FIGS. 8A and 8B is "µm". FIGS. 8A and 8B show examples in which the area of the pn interface 26 (Zener area) is made equal between the semiconductor device 101 according to the comparative example and the semiconductor device 1 according to the first embodiment. All the following description relates to the planar structure, and the shape and dimension are those as viewed from above.

As shown in FIG. 8A, in the general configuration of the Zener diode region in the semiconductor device 101 according to the comparative example, a plurality of squares are concentrically arranged except the opening 22 and the contact region 29. The shape of the pn interface 26, i.e., the shape of the n-type region 18, is a square measuring 4 µm on a side. The distance between the pn interface 26 and the device isolation insulating film 14 is 6 µm. Hence, the shape of the opening 21, i.e., the shape of the p-type region 25, is a square measuring 16 μm on a side. Furthermore, the distance between the opening 21 and the n-type region 118 is 4 μm. The width of the n-type region 118 is 6 μm. The distance between the n-type region 118 and the frame member 17 is 1 μm. The width of the frame member 17 is 1 μm. Thus, the shape of the Zener diode region in the semiconductor device 101 is generally a square measuring 40 μm on a side. Hence, the area of the Zener diode region is approximately 1600 μm$^2$.

As shown in FIG. 8B, in the Zener diode region in the semiconductor device 1 according to the first embodiment, the p-type region 25 and the low concentration region 28 are each shaped like a square and concentrically arranged. However, the n-type region 18 and the frame member 17 have a generally rectangular shape. More specifically, the shape of the p-type region 25 is a square measuring 6 μm on a side. The low concentration region 28 is shaped like a square frame in which one side of the inner edge is 4 μm, one side of the outer edge is 8 μm, and the width is 2 μm. Hence, the shape of the pn interface 26 is a square measuring 4 μm on a side. The distance between the outer edge of the low concentration region 28 and the outer edge of the n-type region 18 is 1 to 2 μm on three sides not opposed to the opening 22, and 6 to 7 μm on one side opposed to the opening 22. Of this distance, the width of the opening 22 is 2 μm. Hence, the shape of the n-type region 18 is generally a rectangle with the long side measuring 16 μm and the short side measuring 11 μm. Furthermore, the distance between the n-type region 18 and the frame member 17 is 1 μm. The width of the frame member 17 is 1 μm. Thus, the shape of the Zener diode region in the semiconductor device 1 is generally a rectangle with the long side measuring 20 μm and the short side measuring 15 μm. Hence, the area of the Zener diode region is approximately 300 μm$^2$.

Thus, for an equal Zener area, the above first embodiment can reduce the Zener diode area to approximately 20% of that of the comparative example. This effect also applies to the above second embodiment.

Here, to prevent charge-up of the device isolation insulating film, it may be contemplated to eliminate the device isolation insulating film itself. Then, however, the p-type region 25 cannot be formed in a self-aligned manner. This increases the area of the p-type region 25, and requires increasing the distance between the p-type region 25 and the contact region 29. Thus, the area of the Zener diode region increases.

The embodiments described above can realize a semiconductor device and a method for manufacturing the same in which the Zener diode can be downsized.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

For instance, the high concentration region 16 can be omitted. Furthermore, if the distance to the adjacent device element can be sufficiently ensured, or if electrical isolation therefrom can be achieved by other means, the frame member 17 can be omitted. Furthermore, while the examples described in the above embodiments use silicon for the semiconductor material and silicon oxide for the insulating material, the invention is not limited thereto.

What is claimed is:

1. A semiconductor device comprising:
a semiconductor substrate;
a first conductivity type region formed in part of the semiconductor substrate;
a device isolation insulating film formed on an upper surface of the semiconductor substrate and including an opening formed in a part of the device isolation insulating film that immediately overlies the first conductivity type region;
a second conductivity type region formed in the opening, and being in contact with the first conductivity type region and a side surface of the device isolation insulating film that is exposed by the opening; and
a low concentration region having second conductivity type and an effective impurity concentration lower than an effective impurity concentration of the second conductivity type region, the low concentration region being formed along the side surface of the device isolation insulating film that is exposed by the opening so as to separate an interface of the first conductivity type region and the second conductivity type region from the device isolation insulating film.

2. The device according to claim 1, wherein the second conductivity type region is formed entirely in the opening as viewed from above.

3. The device according to claim 1, wherein the device isolation insulating film includes one other opening formed in one other part of the immediately overlying region of the first conductivity type region.

4. The device according to claim 3, further comprising:
a contact region formed in the one other opening in the semiconductor substrate, connected to the first conductivity type region, having first conductivity type, and having an effective impurity concentration higher than an effective impurity concentration of the first conductivity type region.

5. The device according to claim 1, further comprising:
a high concentration region formed immediately below the first conductivity type region, being in contact with a lower surface of the first conductivity type region, having first conductivity type, and having an effective impurity concentration higher than an effective impurity concentration of the first conductivity type region.

6. The device according to claim 1, further comprising:
a frame member made of an insulating material and formed like a frame in a region surrounding the first conductivity type region in the semiconductor substrate as viewed from above.

7. The device according to claim 1, wherein the low concentration region covers continuously the peripheral portion of the lower surface of the second conductivity type region, the lower portion of the side surface of the opening of the device isolation insulating film, and the portion, being in contact with the side surface of the opening, of the lower surface of the device isolation insulating film.

8. A semiconductor device comprising:
a semiconductor substrate;
a first conductivity type region formed in part of the semiconductor substrate;
a device isolation insulating film formed on an upper surface of the semiconductor substrate and including an opening formed in a part of the device isolation insulating film that immediately overlies the first conductivity type region;

a second conductivity type region formed in the opening, and being in contact with the first conductivity type region and a side surface of the device isolation insulating film that is exposed by the opening; and a low concentration region having an effective impurity concentration lower than an effective impurity concentration of the first conductivity type region and the second conductivity type region, the low concentration region being formed along the side surface of the device isolation insulating film that is exposed by the opening so as to separate an interface of the first conductivity type region and the second conductivity type region from the device isolation insulating film.

9. The device according to claim 8, wherein the low concentration region has second conductivity type.

10. The device according to claim 8, wherein the low concentration region has first conductivity type.

11. The device according to claim 8, wherein the second conductivity type region is formed entirely in the opening as viewed from above.

12. The device according to claim 8, wherein the device isolation insulating film includes one other opening formed in one other part of the immediately overlying region of the first conductivity type region.

13. The device according to claim 12, further comprising:

a contact region formed in the one other opening in the semiconductor substrate, connected to the first conductivity type region, having first conductivity type, and having an effective impurity concentration higher than an effective impurity concentration of the first conductivity type region.

14. The device according to claim 8, further comprising:

a high concentration region formed immediately below the first conductivity type region, being in contact with a lower surface of the first conductivity type region, having first conductivity type, and having an effective impurity concentration higher than an effective impurity concentration of the first conductivity type region.

15. The device according to claim 8, further comprising:

a frame member made of an insulating material and formed like a frame in a region surrounding the first conductivity type region in the semiconductor substrate as viewed from above.

16. The device according to claim 8, wherein the low concentration region covers continuously the peripheral portion of the lower surface of the second conductivity type region, the lower portion of the side surface of the opening of the device isolation insulating film, and the portion, being in contact with the side surface of the opening, of the lower surface of the device isolation insulating film.

17. The device according to claim 8, further comprising:

a reverse conductivity type region formed between the semiconductor substrate and the first conductivity type region, having reverse conductivity type of a conductivity type of the semiconductor substrate.

18. The device according to claim 8, wherein the low concentration region covers a periphery region of a lower surface of the second conductivity type region and at least a portion of a side surface of the opening of the device isolation insulating film, the periphery region is contact with the side surface.

19. The device according to claim 8, further comprising:

a frame member made of an insulating material formed under the device isolation insulating film and surrounding the first conductivity type region; and a first conductivity type low concentration region formed between the frame member and the first conductivity type region, having an effective impurity concentration lower than an effective impurity concentration of the first conductivity type region.

20. The device according to claim 17, further comprising:

a frame member made of an insulating material formed under the device isolation insulating film, surrounding the first conductivity type region and penetrating through the reverse conductivity type region; and a reverse conductivity type low concentration region formed between the frame member and the first conductivity type region, having reverse conductivity type of a conductivity type of the semiconductor substrate.

* * * * *